US 6,605,538 B2

(12) United States Patent
Hong

(10) Patent No.: US 6,605,538 B2
(45) Date of Patent: *Aug. 12, 2003

(54) METHODS FOR FORMING FERROELECTRIC CAPACITORS

(75) Inventor: Kwon Hong, Kyoungkido (KR)

(73) Assignee: Hyundai Electronics Industries Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,621

(22) Filed: Dec. 28, 1998

(65) Prior Publication Data

US 2001/0029101 A1 Oct. 11, 2001

(30) Foreign Application Priority Data

Dec. 27, 1997 (KR) .......................... 1997-75102

(51) Int. Cl.$^7$ ................................................ H01L 21/00
(52) U.S. Cl. ..................... 438/692; 438/653; 438/745
(58) Field of Search .......................... 438/3, 653, 648, 438/700, 706, 692, 745, 753

(56) References Cited

U.S. PATENT DOCUMENTS

| 5,155,573 A | | 10/1992 | Abe et al. ..................... 357/51 |
|---|---|---|---|
| 5,212,620 A | * | 5/1993 | Evans, Jr. et al. ........... 361/313 |
| 5,552,341 A | * | 9/1996 | Lee .............................. 437/192 |
| 5,677,825 A | | 10/1997 | Evans, Jr. et al. ........ 361/321.4 |
| 5,729,054 A | * | 3/1998 | Summerfelt et al. ......... 257/751 |
| 5,753,945 A | | 5/1998 | Chivukula et al. .......... 257/295 |
| 5,844,771 A | * | 12/1998 | Graettinger et al. ........ 361/303 |
| 5,854,104 A | * | 12/1998 | Onishi et al. ............... 438/240 |
| 5,965,942 A | * | 10/1999 | Itoh et al. .................... 257/761 |
| 5,972,791 A | * | 10/1999 | Schuele ....................... 438/653 |
| 5,976,928 A | * | 11/1999 | Kirlin et al. ................ 438/240 |
| 6,001,660 A | * | 12/1999 | Park et al. ....................... 438/3 |
| 6,204,070 B1 | * | 3/2001 | Kim ................................ 438/3 |

FOREIGN PATENT DOCUMENTS

| JP | 08166527 | 6/1996 |
|---|---|---|
| JP | 08333366 | 12/1996 |

* cited by examiner

Primary Examiner—William A. Powell
(74) Attorney, Agent, or Firm—Blakely, Sokoloff, Taylor & Zafman

(57) ABSTRACT

Provided are methods for forming ferroelectric capacitors, which prevent decreasing ferroelectric characteristics due to the reaction of a ferroelectric layer with hydroxyl group induced from a inter-layer insulating film which will be formed and contacted with the ferroelectric layer after the formation of the ferroelectric capacitor. After a ferroelectric film such as $Pb(Zr,Ti)O_3$ (PZT) is formed, a $ZrO_2$ film, which is insulator and excellent in diffusion barrier characteristics, is formed so as to enclose the entire ferroelectric layer in order to prevent the damage generated by the reaction. The characteristics of the ferroelectric capacitor are enhanced by the invention.

23 Claims, 2 Drawing Sheets

METHODS FOR FORMING FERROELECTRIC CAPACITORS

FIELD OF THE INVENTION

The present invention relates to methods for fabricating semiconductor devices; and, more particularly, to methods for forming ferroelectric capacitors.

DESCRIPTION OF THE PRIOR ART

Memory elements (FRAMs) using ferroelectric capacitors store information by switching capacitors as different from DRAM elements. Thus, the ferroelectric having switching property such as PZT and strontium bismuth tantalate (hereinafter, referred to as SBT) has been used as a dielectric layer of capacitors in the memory elements as different from DRAM using common dielectric. However, the ferroelectric layer is contacted with silicon dioxide containing many hydroxyl groups at the process of planarization after capacitor forming process. Accordingly, there is a drawback in the prior ferroelectric capacitors that such hydroxyl groups react with the ferroelectric such as PZT and SBT, thereby decreasing the characteristics of the ferroelectric by its reduction.

SUMMARY OF THE INVENTION

It is, therefore, an object of the present invention to provide methods for forming ferroelectric capacitors which can prevent the decreasing of the characteristics of the ferroelectric by blocking the reaction of the ferroelectric layer with hydroxyl group induced from the layer of inter-layer insulator which is formed after the formation of the capacitor and contacted with the ferroelectric layer.

In accordance with one embodiment of the invention, there is provided a method for forming ferroelectric capacitor, which comprises the steps of: forming a lower electrode over a semiconductor substrate; forming a layer of ferroelectric material on said lower electrode; forming a layer of $ZrO_2$ as a diffusion barrier which encloses portions of said ferroelectric layer other than a portion through which the ferroelectric layer will be connected to an upper electrode; forming said upper electrode to connect to said ferroelectric layer.

In accordance with another embodiment of the invention, there is also provided a method for forming ferroelectric capacitor which comprises the steps of: selectively etching an insulating layer formed over a semiconductor substrate so as to expose said substrate or a predetermined conductive layer, thereby forming a contact hole; burying conductive material in said contact hole to form a first conductive layer; forming a first diffusion barrier layer over the entire substrate; forming a second conductive layer for forming a lower electrode over the entire substrate; forming a ferroelectric layer on said second conductive layer; patterning said ferroelectric, said second conductive and said diffusion barrier layers; forming a second diffusion barrier layer over the entire substrate so as to enclose said ferroelectric layer; selectively etching said second diffusion barrier layer to expose said ferroelectric layer in the portion which will be contacted with an upper electrode; forming said upper electrode so as to connect to said ferroelectric layer.

The invention enhances the characteristics of the ferroelectric capacitor by forming the diffusion barrier layer using the insulating and diffusion barrier materials such as $ZrO_2$, $Y_2O_3$, $CrO_2$, $CeO_2$, $ZrN$ and $TaN$ to prevent the damage of the ferroelectric layer due to the hydroxyl group generated when an oxide layer is formed as an inter-layer insulator after the formation of the ferroelectric layer such as $Pb(Zr,Ti)O_3$ (PZT).

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiments with reference to the accompanying drawings.

Figure 1:
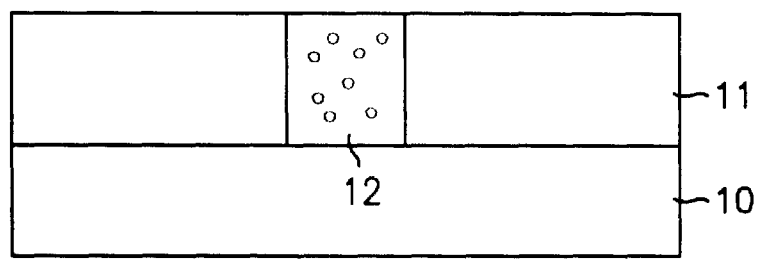
FIGS. 1 through 5 schematically depict various steps in the forming of the ferroelectric capacitor according to a preferred embodiment of the invention.

First, referring to FIG. 1, an insulating layer 11 on a silicon substrate 10 is selectively etched to expose the surface of the silicon substrate 10, thereby forming a contact hole. Polysilicon is deposited over the silicon substrate 10 by chemical vapor deposition (CVD) to be filled in the contact hole. The thickness of the polysilicon layer is preferably about 500 to 3000 Å. The polysilicon layer is then performed of planarization by chemical mechanical polishing (CMP) process to produce a polysilicon plug 12 in the contact hole.

Figure 2:
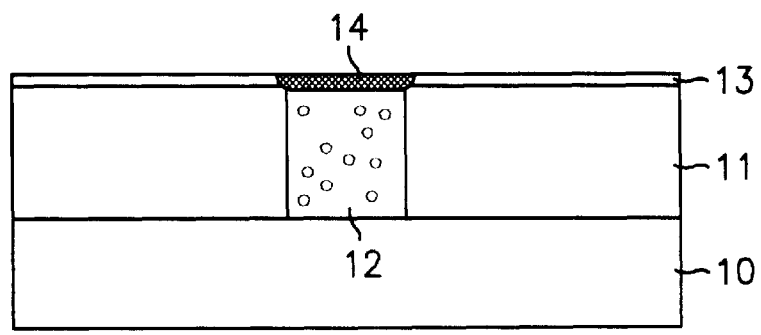

Next, referring to FIG. 2, after the natural oxide film (not shown) on the polysilicon plug 12 is removed, a Ti layer 13 is deposited to a thickness of about 200 to 500 Å. The deposited Ti layer 13 is then treated by rapid thermal process (RTP) under nitrogen atmosphere at about 700 to 800° C., thereby forming titanium silicide layer 14 for decreasing contact resistance.

Figure 3:
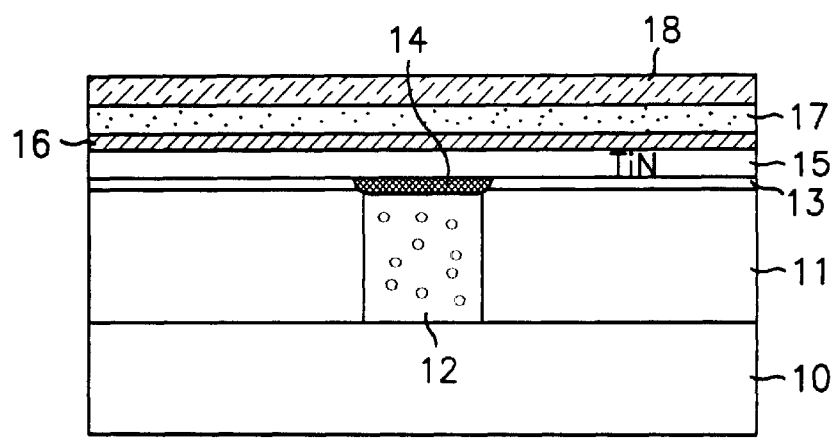

Next, referring to FIG. 3, a TiN layer 15 is deposited to a thickness of about 300 to 1000 Å over the entire silicon substrate 10 in order to prevent diffusion between the polysilicon layer and a lower electrode which will be formed later as described below. And a TiNO layer 16 is formed by performing oxygen stuffing using rapid thermal treatment under oxygen atmosphere at about 600 to 700° C. in order to enhance the characteristic of the diffusion barrier. A Pt lower electrode layer 17 is then deposited over the entire silicon substrate 10. Subsequently, a ferroelectric layer such as PZT is deposited on the lower electrode. At this point, when PZT is used as ferroelectric material among the processes for fabricating the ferroelectric capacitor, it is deposited to a thickness of about 1000 to 3000 by physical vapor deposition or chemical vapor deposition. The composition ratio between Zr and Ti in PZT is 1:1. When SBT is used, it may be also deposited to a thickness of about 1000 to 3000 Å by spin coating method or liquid source misted chemical deposition (LSMCD).

Figure 4:
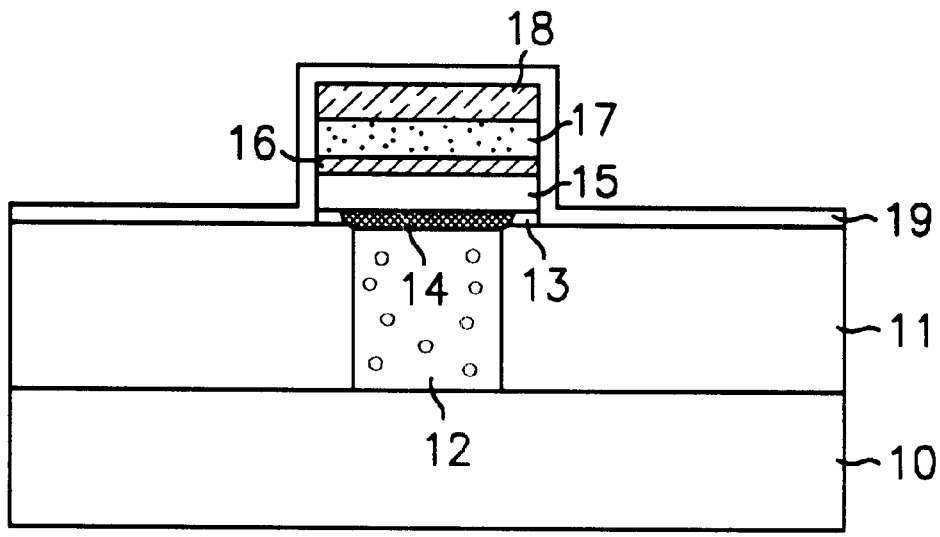

Next, referring to FIG. 4, patterned are the ferroelectric layer 18, the lower electrode layer 17, the TiNO layer 16, and the TiN layer 15. A $ZrO_2$ layer 19 is then formed to a thickness of about 500 to 2000 Å over the entire silicon substrate 10 by chemical vapor deposition or sputtering method.

Figure 5:
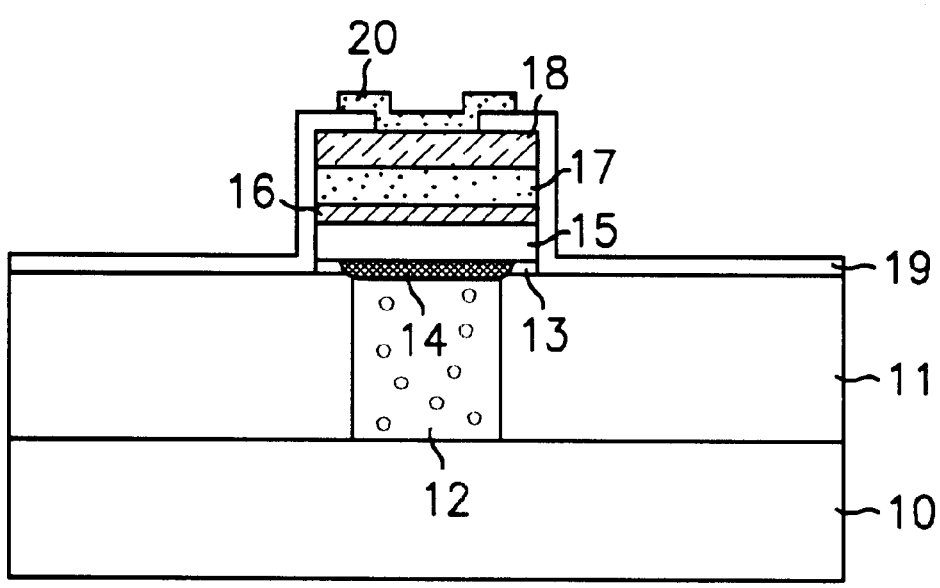

Next, referring to FIG. 5, the $ZrO_2$ layer 19 is selectively etched to expose the portion of the ferroelectric layer 18 that will be contacted with an upper electrode. The upper electrode 20 is then formed to a thickness of about 1000 to 2000 Å by chemical vapor deposition.

Though it is described in the above-mentioned preferred embodiment of the invention that the $ZrO_2$ layer is formed as a diffusion barrier layer in order to prevent the ferroelectric layer from decreasing its characteristics, the thin films of $Y_2O_3$, $CrO_2$, $CeO_2$, ZrN, and TaN may be used as the diffusion barrier layer, which are excellent in insulating characteristic and thermal stability at high temperature.

While the present invention has been described with respect to certain preferred embodiments only, other modifications and variations may be made without departing from the spirit and scope of the present invention as set forth in the following claims.

What is claimed is:

1. A method for forming a ferroelectric capacitor comprising:

forming a lower electrode over a semiconductor substrate;

forming a ferroelectric layer over the lower electrode;

forming a diffusion barrier layer over the ferroelectric layer to enclose sidewalls and a top surface of the ferroelectric layer, wherein the diffusion barrier layer is formed with material selected from the group consisting of $Y_2O_3$, $CrO_2$, $CeO_2$ and ZrN;

etching the diffusion barrier layer to expose a portion of the top surface of the ferroelectric layer; and forming an upper electrode on the exposed portion of the ferroelectric layer and a portion of the diffusion barrier layer.

2. A method for forming ferroelectric capacitor comprising the steps of:

selectively etching an insulating layer formed over a semiconductor substrate so as to expose said substrate or a predetermined conductive layer, thereby forming a contact hole;

burying conductive material in the contact hole to form a first conductive layer;

forming a first diffusion barrier layer over the entire substrate;

forming a second conductive layer over the first diffusion barrier layer to form a lower electrode over the entire substrate;

forming a ferroelectric layer over the second conductive layer;

patterning the ferroelectric layer, the second conductive layer and the first diffusion barrier layer;

forming a second diffusion barrier layer over the entire substrate so as to enclose the patterned ferroelectric layer, the second conductive layer and the first diffusion layer;

selectively etching the second diffusion barrier layer to expose a portion of the ferroelectric layer; and forming an upper electrode on the exposed portion of the ferroelectric layer and a portion of the second diffusion barrier layer.

3. The method according to claim 2, wherein said step of forming said first diffusion barrier layer further comprises the steps of:

forming a Ti layer over said entire semiconductor substrate;

forming a TiSix layer on the surface of said first conductive layer by rapid thermal treatment of said Ti layer;

forming a TiN layer over the entire semiconductor substrate; and forming a TiNO layer by performing oxygen stuffing to said TiN layer using rapid thermal treatment.

4. The method according to claim 3, wherein said Ti layer is formed to a thickness of 200 to 500 Å.

5. The method according to claim 3, wherein said $TiSi_x$ layer is formed at 700 to 800° C. under nitrogen atmosphere.

6. The method according to claim 4, wherein said $TiSi_x$ layer is formed at 700 to 800° C. under nitrogen atmosphere.

7. The method according to claim 5, wherein said TiN layer is formed to a thickness of 300 to 1000 Å.

8. The method according to claim 5, wherein said TiNO layer is formed at 600 to 700° C.

9. The method according to claim 2, wherein said ferroelectric material is $Pb(Zr,Ti)O_3$.

10. The method according to claim 9, wherein said $Pb(Zr,Ti)O_3$ is deposited by physical vapor deposition or chemical vapor deposition.

11. The method according to claim 9, wherein the composition ratio between Zr and Ti in said Pb(Zr,Ti)O3 is 1:1.

12. The method according to claim 9, wherein said layer of $Pb(Zr,Ti)O_3$ is formed to a thickness of 1000 to 3000 Å.

13. The method according to claim 2, wherein said ferroelectric material is strontium bismuth tantalate (SBT).

14. The method according to claim 13, wherein said layer of SBT is formed by spin coating or liquid source mixed chemical deposition (LSMCD).

15. The method according to claim 14, wherein said layer of SBT is formed to a thickness of 1000 to 3000 Å.

16. The method according to claim 2, wherein said second diffusion barrier layer is formed with $ZrO_2$.

17. The method according to claim 16, wherein said layer of $ZrO_2$ is formed to a thickness of 500 to 2000 Å.

18. The method according to claim 16, wherein said layer of $ZrO_2$ is formed by chemical vapor deposition or sputtering processes.

19. The method according to claim 2, wherein the material for said the second diffusion barrier layer is selected from group consisting of $Y_2O_3$, $CrO_2$, $CeO_2$, ZrN and TaN.

20. The method according to claim 2, wherein the material for said upper and said lower electrode is Pt.

21. The method according to claim 20, wherein said Pt is deposited by chemical vapor deposition.

22. The method according to claim 21, wherein said layers of Pt are formed to a thickness of 1000 to 2000 Å.

23. The method according to claim 2, wherein the method further comprises the step of removing a natural oxide film formed on said polysilicon after burying said polysilicon layer in said contact hole.

* * * * *